United States Patent [19]
Kurbikoff et al.

[11] Patent Number: 5,259,767
[45] Date of Patent: Nov. 9, 1993

[54] CONNECTOR FOR A PLATED OR SOLDERED HOLE

[75] Inventors: Peter A. Kurbikoff, San Diego; Apichart N. Chitamitara, Northridge, both of Calif.

[73] Assignee: Teledyne Kinetics, San Diego, Calif.

[21] Appl. No.: 911,774

[22] Filed: Jul. 10, 1992

[51] Int. Cl.⁵ .......................................... H01R 23/70
[52] U.S. Cl. .......................................... 439/59; 439/60
[58] Field of Search ............... 439/59, 60, 62, 630, 439/636, 637, 876, 387

[56] References Cited

U.S. PATENT DOCUMENTS

| | | | |
|---|---|---|---|
| 2,990,533 | 6/1961 | Hughes et al. | 439/84 |
| 3,140,907 | 7/1964 | Davies | 339/17 |
| 3,173,732 | 3/1965 | James | 339/17 |
| 3,215,968 | 11/1965 | Herrmann | 339/17 |
| 3,500,285 | 3/1970 | Jones et al. | 339/17 |
| 3,518,612 | 6/1970 | Dunman et al. | 339/19 |
| 3,731,252 | 5/1973 | McKeown et al. | 439/59 |
| 3,795,037 | 3/1974 | Luttmer | 29/628 |
| 3,795,884 | 3/1974 | Kotaka | 339/17 |
| 3,829,817 | 8/1974 | Beavitt | 339/17 |
| 3,858,154 | 12/1974 | William | 339/17 |
| 3,858,961 | 1/1975 | Goodman et al. | 339/17 |
| 3,922,051 | 11/1975 | Reynolds | 339/17 |
| 3,954,317 | 5/1976 | Gilissen et al. | 339/17 |
| 3,960,424 | 6/1976 | Weisenburger | 339/17 |
| 3,969,010 | 6/1976 | Nailor III et al. | 439/59 |
| 3,993,383 | 11/1976 | Marino | 439/885 |
| 4,003,621 | 1/1977 | Lamp | 339/59 |
| 4,021,091 | 5/1977 | Anhalt et al. | 339/17 |
| 4,057,311 | 11/1977 | Evans | 339/17 |
| 4,159,154 | 6/1979 | Arnold | 339/74 |
| 4,204,205 | 5/1980 | Yagi et al. | 340/719 |
| 4,295,700 | 10/1981 | Sado | 339/61 |
| 4,402,562 | 8/1983 | Sado | 339/61 |
| 4,445,735 | 5/1984 | Bonnefoy | 339/17 |
| 4,508,398 | 4/1985 | Stepan et al. | 339/17 |
| 4,521,065 | 6/1985 | Nestor et al. | 339/75 |
| 4,538,864 | 8/1985 | Ichimura | 339/17 |
| 4,575,175 | 3/1986 | Wilson | 339/176 |
| 4,577,922 | 3/1986 | Stipanuk et al. | 339/176 |
| 4,636,018 | 1/1987 | Stillie | 339/17 |
| 4,699,593 | 10/1987 | Grabbe et al. | 439/71 |
| 4,715,820 | 12/1987 | Andrews, Jr. et al. | 439/59 |
| 4,738,625 | 4/1988 | Burton et al. | 439/59 |
| 4,867,689 | 8/1989 | Redmond et al. | 439/71 |
| 4,976,629 | 12/1990 | Werner | 439/259 |
| 4,998,886 | 3/1991 | Werner | 439/66 |

OTHER PUBLICATIONS

Brundy, Advertisement entitled *Oikstack Feed-Thru Stacking Connectors*, no date.
PCK Elastomerics, Inc., Advertisement Entitled *Parallel Board Connector*, no date.
Advertisement Entitled *Zone 3 Connectors*, no date.
Ufheil, Joseph C., *Compression Mount Technology for Surface Mate Connectors*, pp. 663-645, no date.
Tecknit, Advertisement re *Zebra, the New Connector Technology*, dated Apr., 1982.
Methode Electronics, Inc., Advertisement Entitled *Surface Mate Surface Compression Connectors*, 1989.
PC Network, Advertisement Entitled *SMT Connectors for High Density Packaging*, p. 33, Aug. 1990.
Connection Technology, Guidelines for Designing Elastomeric Connectors Into the Systems, Aug. 1987.
Advertisement of Connection Technology, Interposer Multichip Socket, Copyright 1988.
Advertisement of PCK Elastomerics, Inc., Carbon Stax Elastomeric Connectors.

*Primary Examiner*—Neil Abrams
*Attorney, Agent, or Firm*—Nydegger & Associates

[57] ABSTRACT

A connector for electrically connecting a plated or soldered through hole of a printed circuit board to another electrical device includes a plurality of conductors each having a deflection arm for maintaining a contact force on the circuit board and a dimple formed as a continuous surface from the deflection arm. Each dimple is sized and shaped to enter a through hole and to electrically contact the plating or solder material formed in the hole. Contact can be at a point within the hole or along the circumference of the hole. In addition, each dimple is sized and shaped to enter a range of through hole sizes. In a preferred embodiment each dimple is formed in a generally pyramidal shape with creased edges and a smooth apex. The dimple may also be formed in a generally conical shape.

21 Claims, 3 Drawing Sheets

CONNECTOR FOR A PLATED OR SOLDERED HOLE

TECHNICAL FIELD

The present invention relates generally to electrical connectors, and particularly to a connector for connecting a plated or soldered through hole of a printed circuit board with another electrical component.

BACKGROUND OF THE INVENTION

In the construction of printed circuit boards the printed circuit traces often terminate in a through hole. The through hole typically has a conductive material (i.e. tin-lead solder, gold plating) formed on the inside diameter of the hole which may also circumscribe the outer periphery of the hole. The conductive material is used to form the electrical connection with the circuit trace. In the assembly of electrical devices such as computers, it is often necessary t o connect a single through hole, or a row of through holes with other electrical components such as another printed circuit board.

In the past this has been accomplished by using connectors that include a conductive wire that is placed into and soldered to the solder or plating material around the through hole. A problem with this type of connection is that the connection is permanent. In order to disconnect such a connector from a printed circuit board the wire must be heated for removal from the hole and then resoldered for reconnection. Such a procedure is expensive and time consuming and may cause damage to the circuit board.

Other types of contacts for connecting the circuit traces to other electrical components are also known in the art. As an example, the circuit traces may terminate in a flat contact pad formed of a conductive material (i.e. tin-lead solder, gold). A non-permanent electrical connection can be made to such a contact pad using a connector having spring loaded contact beams. In general such contact beams are shaped to contact the contact pad at a single point. This concentrated force at the point of contact creates "Hertzian Stress" and is essential to the reliability of the electrical connection.

The contact point on a contact beam may be formed as a dimple that actually contacts the contact pad. The force (i.e. Hertzian Stress) exerted by the spring deflection of the contact beam is concentrated at the dimple. Such a dimple may be formed with a conical point shaped to further concentrate this biasing force and to penetrate the oxide film on the surface of the contact pad. This concentration of force at the point of contact may cause the material of the contact pad of the circuit board to cold flow around the conical point and form a gas tight seal.

The present invention recognizes that a pressure connector may be constructed to contact a through hole (or row of through holes) of a printed circuit board utilizing a non permanent spring loaded connector. Accordingly it is an object of the present invention to provide a removable pressure connector for a plated or soldered through holes of printed circuit boards. It is another object of the present invention to provide a connector having a conductor shaped to enter a through hole and electrically contact plating or solder material formed i or around the hole and to provide a concentrated force and acceptable Hertzian Stress with the through hole. It is another object of the present invention to provide a connector that is adapted to accommodate a range of through hole sizes which is inexpensive to manufacture and easy to use. It is yet another object of the present invention to provide a connector with conductors shaped to provide a locking or retention function between the connector and the printed circuit board.

SUMMARY OF THE INVENTION

In accordance with the present invention a pressure connector for connecting a plated or soldered through hole of a printed circuit board to another electrical device is provided. The pressure connector includes a substrate with a plurality of conductors attached thereto. The conductors include a free end that is adapted to connect to another electrical lead or components such as by soldering. Each conductor also includes a deflection arm. The deflection arm is shaped as a spring member to maintain a deflection or contact force against the circuit board. A dimple is formed on the deflection arm to enter the through hole and to contact the plating or soldering material of the through hole to provide an electrical connection between the conductor and a circuit trace electrically connected to the through hole.

The dimple is formed as a continuous surface projecting from the deflection arm and is sized and shaped to contact the plated or soldered material of the through hole at at least one point along an inside surface or circumference of the through hole. In addition the dimple has an apex formed as a smooth radius so that it can slide over the printed circuit board into engagement with the through hole without any damage to the circuit board.

In a preferred embodiment the dimple has a generally pyramidal shape with a polygonal base and a smooth radius apex. The dimple may also be formed in a generally conical shape. The pyramidal or conical shaped dimple is formed with a height and base diameter suitable for entering a range of diameters of through holes and contacting the plating or solder material formed in and around the through hole. In addition, the sides of the dimple may be formed with creased edges to facilitate contact of the dimple with the conductive material of the through hole.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts.

DESCRIPTION OF PREFERRED EMBODIMENTS

Figure 1:
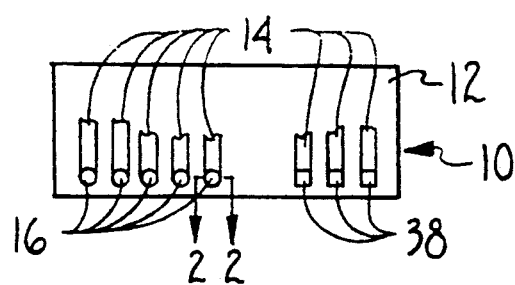
FIG. 1 is a plan view of a printed circuit board showing plated or soldered through holes formed in the circuit board and connected to printed circuit traces.

Referring to FIG. 1 a printed circuit board 10 used in the construction of various electronic devices such as computers is shown. The printed circuit board includes a hard insulating substrate 12 on which various electronic components (not shown) are mounted. A plurality of printed circuit traces 14 are formed on the substrate 12. The printed circuit traces 14 connect the various electronic components and circuits formed on the substrate 12. The printed circuit traces 14 are formed of a conductive material such as tin-lead and may be covered with an insulating material.

Figure 2:
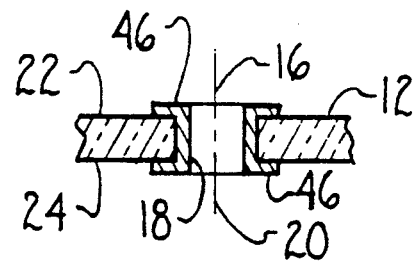
FIG. 2 is a cross section of a through hole taken along section line 2—2 of FIG. 1.

In some applications the printed circuit traces 14 terminate in a through hole 16. A cross section of a through hole 16 is shown in FIG. 2. In general, a through hole 16 extends through the substrate 12 along a longitudinal axis 20. The through hole 16 is located at an end of a printed circuit trace 14 and is adapted to electrically connect the circuit trace 14 with an electrical component located externally of the printed circuit board 10. As an example the electrical component to be connected may be located on another printed circuit board. In the past, an electrical connection has been made using the through hole 16 by placing a wire lead (not shown) through the hole and then soldering the wire lead in the through hole 16.

As shown in FIG. 2, the through hole 16 may be formed with a conductive material 18 such as gold plating or tin-lead solder. The conductive material 18 is formed continuously with the printed circuit trace 14 and electrically connects to the printed circuit trace 14. The conductive material 18 is formed along the inside diameter of the through hole 16 and circumjacent to the through hole 16 along its outer circumference on the top 22 and bottom 24 surfaces of the substrate 12. In the past a wire lead (not shown) of an electrical component to be connected to the through hole 16 is soldered to the conductive material 18.

Figure 3:
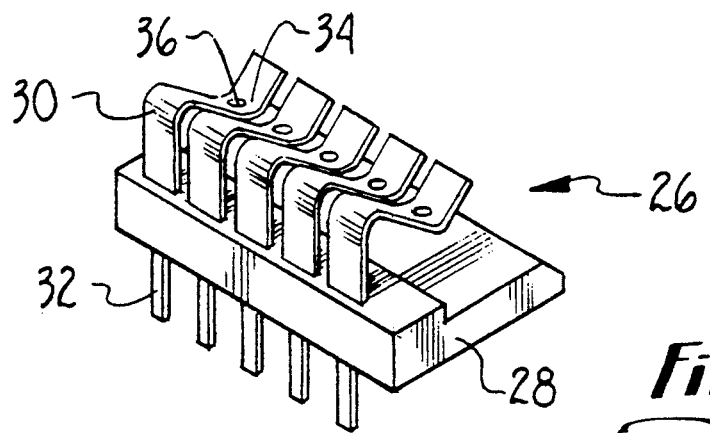
FIG. 3 is a perspective view of a pressure connector formed in accordance with the invention.
Figure 4:
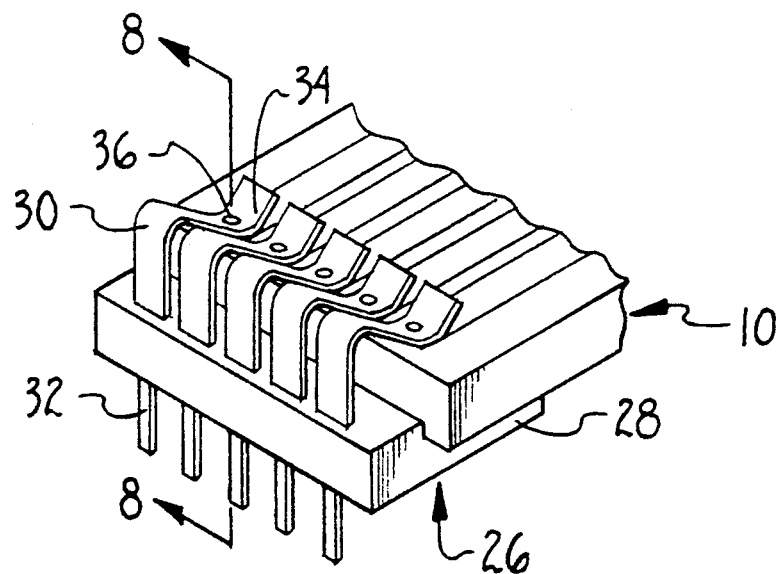
FIG. 4 is a perspective view of a connector assembly formed in accordance with the invention.

Referring now to FIG. 3 a pressure connector 26 formed in accordance with the invention is shown. The pressure connector 26 includes a substrate 28 formed of an insulating material. A plurality of conductors 30 are attached to the substrate 28. The conductors 30 include a free end 32 that is adapted to connect to another electrical lead or component (not shown) such as by soldering. The conductors 30 also include a deflection arm 34 adapted to clamp to and maintain a positive contact force with a printed circuit board such as the printed circuit board 10 shown in FIG. 1. As such, each deflection arm 34 may be formed as a spring member shaped to exert a biasing or contact force against the printed circuit board 10. In use and as shown in FIG. 4, the pressure connector 26 is clamped to the circuit board 10 with the circuit board 10 located between the substrate 28 of the pressure connector 26 and the deflection arms 34 of the conductors 30 of the pressure connector 26.

A dimple 36 (FIG. 5) is formed on a bottom surface 42 of each deflection arm 34. As will hereinafter be more fully explained, in use of the pressure connector 26, the dimples 36 are shaped to enter the through holes 16 and to make electrical contact with the conductive material 18 formed in the through holes 16. The dimples 36 are also formed to maintain an acceptable Hertzian force on the through hole 16 and to lock the connector 26 to the circuit board 10.

Figure 5:
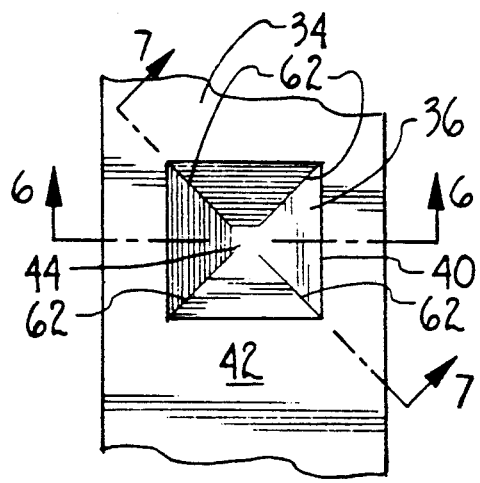
FIG. 5 is a bottom view of a conductor of a pressure connector formed in accordance with the invention showing a generally pyramidal shaped dimple formed on the conductor.
Figure 6:
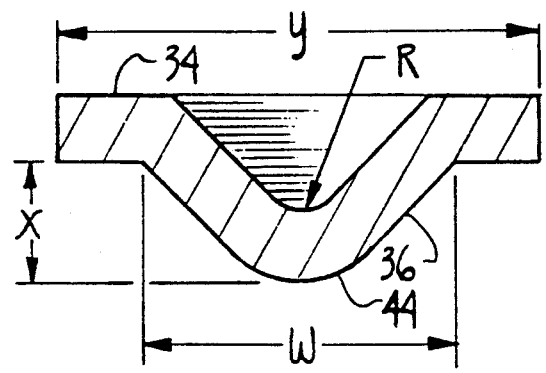
FIG. 6 is a cross section of the dimple taken along section line 6—6 of FIG. 5.
Figure 7:
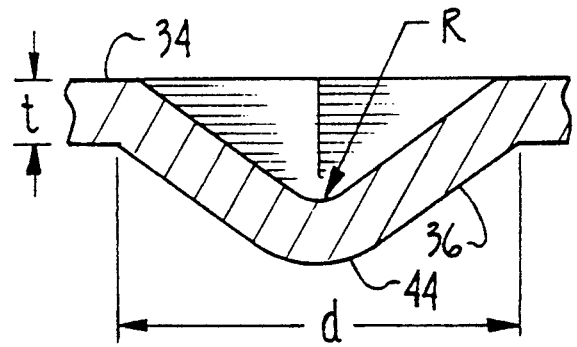
FIG. 7 is a cross section of the dimple taken along section line 7—7 of FIG. 5.

Referring now to FIGS. 5-7 the construction of a dimple 36 is shown. In the embodiment illustrated in FIG. 5 the dimple 36 is formed in a generally pyramidal shape. Alternately the dimple 36 may be formed in any other shape (such as with a conical shape) that permits the dimple 36 to enter the through hole 16 and contact the conductive material 18 within the through hole 16 along an edge, or along the outer circumference of the through hole 16. The dimple 36 may also be formed to contact a flat contact pad 38 (FIG. 1) rather than a through hole 16 which may also be formed at the end of a printed circuit trace 14 (FIG. 1).

With a pyramidal shaped dimple 36, the dimple 36 is formed as a continuous surface from the bottom surface 42 of the deflection arm 34. The dimple 36 includes a generally polygonal (i.e. square) shaped base portion 40 formed at the intersection of the dimple 36 and the bottom surface 42 of the deflection arm 34. In addition the dimple 36 includes a plurality of creased edges 62 formed to contact the through hole 16.

The polygonal shaped base portion 40 of the dimple 36 has a width "w" on each side. By way of illustration and not limitation, for a deflection arm 34 having a width "y" (FIG. 6) of approximately 0.060 inches, and a thickness "t" (FIG. 7) of approximately 0.008 inches, the width "w" (FIG. 6) of a side of the base portion 40 of the dimple 36 is approximately 0.038 inches.

In addition, the dimple 36 extends from the bottom surface 34 of the deflection arm 34 to a height of "x" (FIG. 6). By way of illustration and not limitation, height "x" with the above noted dimensions, is approximately 0.012 inches.

Figure 9:
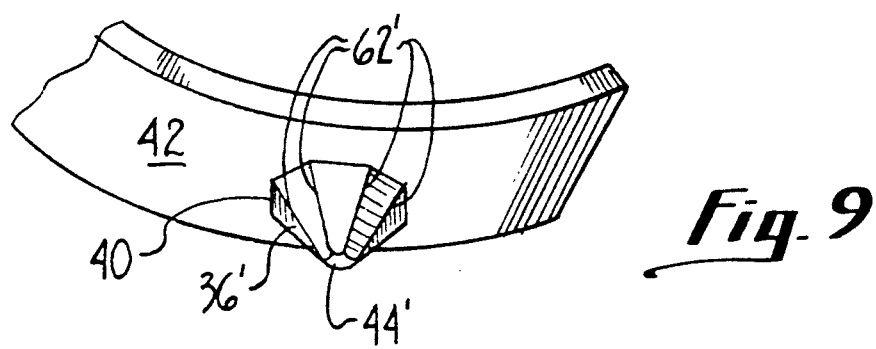
FIG. 9 is a perspective view of an alternate embodiment of a dimple formed with a generally pyramid shape having an octagonal base.

The pyramidal shaped dimple 36 is four sided, with four creased edges 62. The four sides of the dimple 36 taper to an apex 44. The apex 44 does not come to a sharp point but rather is radiused with a radius of "r". By way of illustration and not limitation with the above noted dimensioning, radius "r" may be approximately 0.004 inches. The smooth apex 44 is shaped such that it can slide over the printed circuit board prior to engagement in the through hole 16 without damage to the printed circuit board 22. A dimple 36' may also be formed substantially as shown in FIG. 9 with an octagonal 40' rather than a square shaped base portion. Dimple 36' (FIG. 9) is in all other respects similar to dimple 36 but has eight rather than four creased edges 62' which facilitate more points of contact with the conductive material 18 (FIG. 1) formed in and around the through hole 16.

Figure 8:
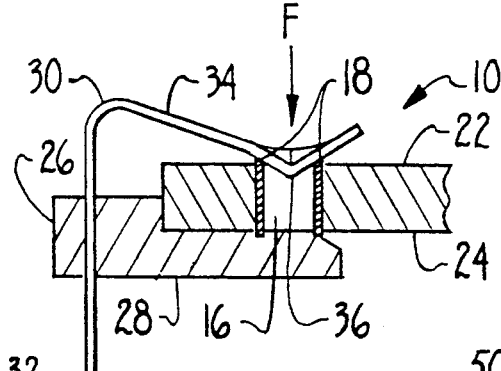
FIG. 8 is a cross section of the connector taken along section line 8—8 of FIG. 4.

Referring now to FIG. 8 a cross section of the connector assembly, showing a dimple 36 located within a through hole 16 of a printed circuit board 10 is shown. As shown, the dimple 36 extends into the through hole 16 and contacts the conductive material 18 formed in the through hole 16. The creased edges 62 of the dimple 36 contact the conductive material 18 formed in the through hole 16 at at least one point within the hole 16. The spring force of the deflection arm 34 provides the biasing or contact force "F" necessary to force the dimple 36 into the through hole 16 and maintain contact of the dimple 36 with the conductive material 18 within the through hole 16 or along a circumferential edge of the through hole 16. The force "F" is sufficient to create an acceptable amount of Hertzian Stress and to clamp the connector to the circuit board 10.

Figure 11:
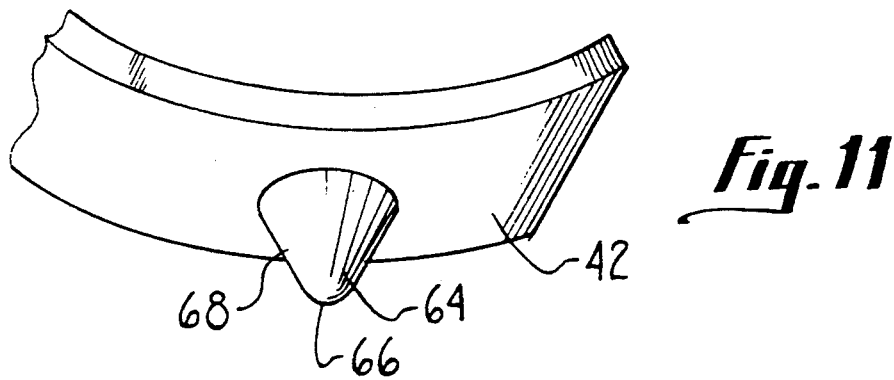
FIG. 11 is a perspective view of an alternate embodiment of a dimple formed with a generally conical shape.

The location of the dimple illustrated in FIG. 8 is for an optimal alignment of the dimple 36 and through hole 16. The dimple 36 is sized to enter and contact the conductive material 18 formed in a through hole 16 in a similar manner over a range of hole sizes. For an out of round through hole 16, or if the dimple 36 is slightly misaligned with respect to the through hole 16, the shape of the dimple 36 is such that contact is made at least one point of contact such as the point of contact of a creased edge 62 with the conductive material 18 formed in the through hole 16. There may however, be more than one point of contact if more than one creased edge 62 contacts the conductive material 18. Moreover contact may include other portions of the dimple than the creased edges and may be along a circumferential edge of the through hole 16. Although in an illustrative embodiment shown in FIG. 5-8 the dimple has been described as formed with a generally pyramid shape; it is understood that the dimple can be formed in other shapes. As an example a generally conically shaped dimple 64 is shown in FIG. 11. The conically shaped dimple 64 is formed with a rounded apex 66 and smooth conical sidewalls 68. In use the sidewalls 8 of the dimple 64 make contact with the conductive material 18 within a through hole 16 substantially as previously described along a circumferential edge of the through hole 16.

Figure 10:
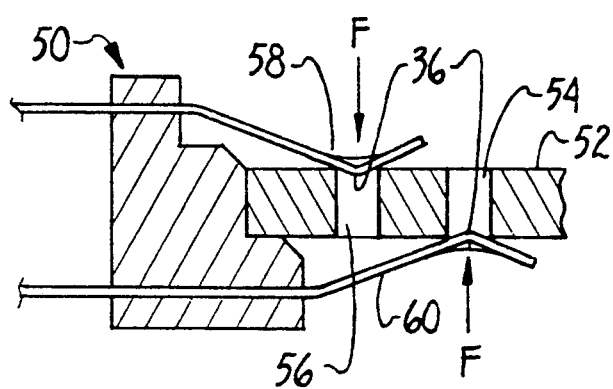
FIG. 10 is a cross section similar to FIG. 8 showing an alternate embodiment connector formed with conductors that contact the circuit board on opposite sides of the circuit board.

Referring now to FIG. 10 another alternate embodiment connector assembly is shown and generally designated 50. The alternate embodiment connector assembly 50 is adapted to contact a circuit board 52 having rows of paired through holes 54,56. As such the connector assembly 50 includes an upper conductor 58 and a lower conductor 60. Each conductor 58, 60 is formed with a dimple 36 substantially as previously described generally pyramidal or conical in shape, to contact one of the through holes 54, 56. A spring force F is thus exerted by the conductors 58, 60 in two directions. These opposing forces F provide a clamping force which create an acceptable amount of Hertzian Stress of the dimples 36 with the holes 54, 56 and for clamping the connector 50 to the printed circuit board 52.

Thus the connector of the invention is adapted to provide a pressure connector for electrically connecting a row of through holes of a printed circuit board with other electrical devices or circuit boards. A dimple formed on a conductor of the pressure connector is adapted to extend into and contact a range of through hole sizes. Contact can be made at least one point along the conductive material formed in the through hole or along a circumferential edge in or around the hole. The pressure connector is formed to maintain a clamping force and a acceptable Hertzian Stress with the through hole.

While the particular Connector for a Plated or Soldered Hole as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

We claim:

1. A connector for electrically connecting a plated or soldered through hole of a circuit board to another electrical device, comprising:
   a substrate;
   a deflectable conductor attached to the substrate and cantilevered therefrom to maintain a positive contact force between said conductor and said circuit board; and
   a dimple shaped with a plurality of edges and formed on the conductor shaped to extend into the through hole and to contact the plated or soldered material formed in and along the circumferential of the through hole to make an electrical contact, the conductor being engageable with the substrate to deflect the conductor and establish said positive contact force pressure and lock the dimple of the conductor to the through hole of the circuit board.

2. The connector as claimed in claim 1 and wherein the dimple is shaped to contact the plating or soldered material at at least one point within the through hole or along a circumferential of the through hole.

3. The connector as claimed in claim 1 and wherein the dimple has a generally pyramidal shape.

4. The connector as claimed in claim 3 and wherein the dimple has a generally conical shape.

5. The connector as claimed in claim 4 and wherein the dimple has a generally smooth and radiused apex portion.

6. The connector as claimed in claim 1 and wherein the dimple has a generally pyramidal shape with an octagonal shaped base portion.

7. The connector as claimed in claim 1 and wherein the connector includes an upper and a lower deflection arm shaped to contact the circuit board on opposite sides.

8. The pressure connector for connecting a plated or soldered through hole of a circuit board with an electrical element comprising:
   a substrate;
   a cantilevered conductor mounted on the substrate and formed with a deflection arm, the substrate being engageable with the circuit board for maintaining a positive contact force between the deflection arm and the circuit board; and
   a dimple shaped with a plurality of edges and formed on the deflection arm extending a distance past a surface of the deflection arm as a continuous surface shaped to enter the through hole and contact the plated or soldered material at at least one point along an edge or circumference of the through hole.

9. The connector as claimed in claim 8 and wherein the dimple has a generally pyramidal shape and is sized and shaped to enter and contact a range of diameters of through holes.

10. The connector as claimed in claim 8 and wherein the simple has a generally conical shape and is sized and shaped to enter and contact a range of diameters of through holes.

11. The connector as claimed in claim 8 and wherein the dimple has a pyramidal shape and a polygonal shaped base portion and four edges.

12. The connector as claimed in claim 8 and wherein the dimple has a generally square base formed at the intersection with the deflection arm.

13. The connector as claimed in claim 8 and wherein the dimple has a generally octagonal shaped base formed at the intersection with the deflection arm.

14. The connector as claimed in claim 8 and wherein the dimple has a radiused and smooth apex portion.

15. The connector as claimed in claim 8 and wherein said connector further comprises a plurality of cantilevered conductors, said conductors extend from the substrate to contact opposite surfaces of the circuit board and maintain a normal clamping force of the connector to the circuit board.

16. A connector for connecting a soldered or plated through hole of a circuit board with an electrical device comprising:
   a substrate including a plurality of cantilevered conductors each conductor being established as a deflection arm attached to the substrate; and
   a dimple shaped with a plurality of edges and formed on each deflection arm, the dimple having a height and a base and continuously extending from the deflection arm with the dimple shaped to enter the through hole for electrical contact between the dimple and the plated or soldered material along an edge or circumference of the through hold upon engagement of the substrate with the circuit board.

17. The connector as claimed in claim 16 and wherein the dimple is generally pyramidal in shape for contacting the plated or soldered material.

18. The connector as claimed in claim 17 and wherein the dimple has a height of about 0.012".

19. The connector as claimed in claim 18 and wherein the pyramid has a generally square shaped base portion and four creased edges.

20. The connector as claimed in claim 19 and wherein each side of the base portion has a width of about 0.038".

21. The connector as claimed in claim 16 and wherein the dimple is generally conical in shape.

* * * * *